(12) United States Patent
Matsuoka

(10) Patent No.: US 9,019,691 B1
(45) Date of Patent: Apr. 28, 2015

(54) COMBINED BEZEL AND BUMPER

(71) Applicant: Google Inc., Mountain View, CA (US)

(72) Inventor: Yoshimichi Matsuoka, Cupertino, CA (US)

(73) Assignee: Google Inc., Mountain View, CA (US)

( * ) Notice: Subject to any disclaimer, the term of this patent is extended or adjusted under 35 U.S.C. 154(b) by 187 days.

(21) Appl. No.: 13/685,005

(22) Filed: Nov. 26, 2012

(51) Int. Cl.
*H05K 5/00* (2006.01)
*G06F 1/16* (2006.01)
*H05K 13/00* (2006.01)

(52) U.S. Cl.
CPC .............. *G06F 1/1637* (2013.01); *H05K 13/00* (2013.01)

(58) Field of Classification Search
CPC ............................... G06F 1/1616; H05K 5/02
USPC ................. 361/679.27, 679.01; 248/615, 638
See application file for complete search history.

(56) References Cited

U.S. PATENT DOCUMENTS

| | | | |
|---|---|---|---|
| 6,353,531 B1 * | 3/2002 | Howell et al. | 361/679.24 |
| 7,245,484 B2 * | 7/2007 | Langerhans et al. | 361/679.27 |
| 7,301,761 B2 * | 11/2007 | Merz et al. | 361/679.27 |
| 7,359,740 B2 * | 4/2008 | Okuzako et al. | 455/575.3 |
| 7,379,128 B2 * | 5/2008 | Tsubokura et al. | 349/60 |
| 7,403,377 B2 * | 7/2008 | Deluga | 361/679.55 |
| 7,948,752 B2 * | 5/2011 | Tatsukami et al. | 361/679.58 |
| 8,049,836 B2 * | 11/2011 | Huang et al. | 349/58 |
| 8,213,117 B2 * | 7/2012 | Antoku et al. | 360/125.31 |
| 8,270,148 B2 * | 9/2012 | Griffith et al. | 361/679.01 |
| 2008/0170357 A1 * | 7/2008 | Hsu | 361/681 |
| 2011/0141571 A1 * | 6/2011 | Allen | 359/609 |

OTHER PUBLICATIONS

Hewlett packard company Rudy Widiaman, Britt Ashcraft, Eric Chen research disclosure database # 570028 published in Oct. 2011.*

* cited by examiner

*Primary Examiner* — Timothy Thompson
*Assistant Examiner* — Rashen E Morrison
(74) *Attorney, Agent, or Firm* — Brake Hughes Bellermann LLP

(57) ABSTRACT

In accordance with aspects of the disclosure, a device may include a base and a display. The base may include a base enclosure formed to include internal circuitry, and the display may include a display enclosure formed to include an electronic visual display panel. The display enclosure may be pivotally coupled to the base and configured for movement between open and closed positions. The display enclosure may include a bezel coupled to a periphery of the display enclosure so as to overlap at least a portion of the electronic visual display panel. The bezel may be configured to cover the periphery of the display enclosure with the overlapped portion of the electronic visual display panel interposed between the display enclosure and the bezel. The bezel may include at least one bumper feature including a malleable coating that contacts the base enclosure when the display enclosure is in the closed position.

21 Claims, 11 Drawing Sheets

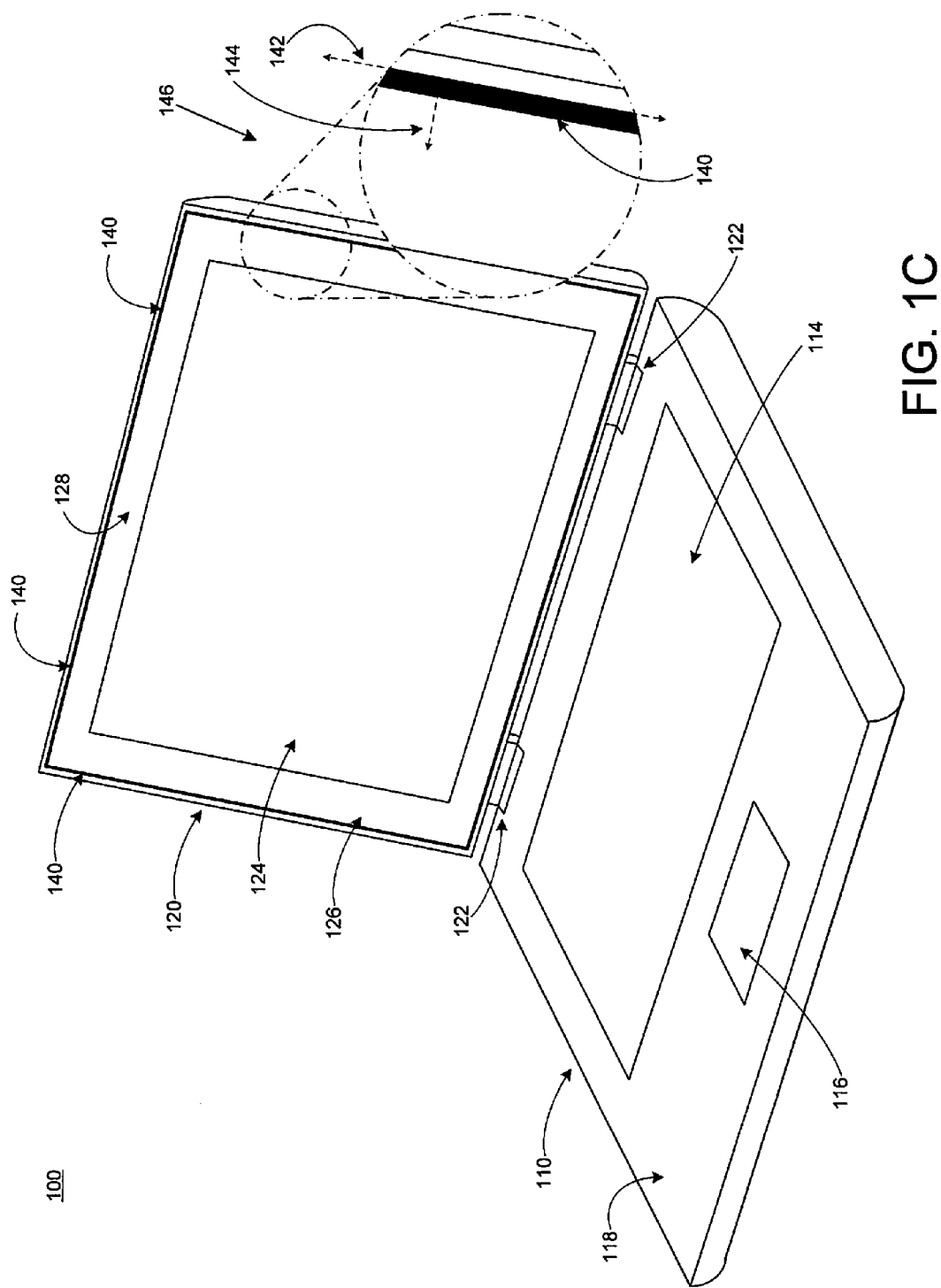

COMBINED BEZEL AND BUMPER

TECHNICAL FIELD

This disclosure relates to combining a bezel and bumper for computing device enclosures.

BACKGROUND

In recent trends, portable computing devices are becoming popular due in part to user demand. Conventional portable computing devices such as laptops include folding members adapted for movement between open and closed positions. When in the closed position, at least one of the folding members includes bumpers to prevent surfaces of the folding members from directly touching, which may cause scratches and/or dents during transport of the laptop. Typically, these bumpers may be manufactured separately form the device itself and may be separately coupled to one of the folding members during assembly. Unfortunately, this manufacturing process can be complex, which may be costly and time-consuming. Accordingly, there exists a need to improve efficiency of manufacturing portable computing devices such as laptops.

SUMMARY

In accordance with aspects of the disclosure, a device may include a combined bezel and bumper. The device may include a base configured to include internal circuitry including at least one processor and at least one memory. The device may include a display pivotally coupled to the base and configured for movement between an open position and closed position. The display may include an enclosure having an exterior side surface and an interior side surface opposite the exterior side surface. The display may include a panel coupled to a central region of the interior side surface of the enclosure. The panel may include an electronic visual display. The display may include a bezel coupled to a peripheral region of the interior side surface of the enclosure so as to overlap at least a portion of the electronic visual display. The bezel may include an interior side surface that covers the peripheral region of the interior side surface of the enclosure with the overlapped portion of the electronic visual display interposed between the enclosure and the bezel. The bezel may include an exterior side surface with at least one bumper protrusion integrated as a part of the exterior side surface. The at least one bumper protrusion may include a malleable coating that contacts the base when the display is in the closed position.

In accordance with aspects of the disclosure, a method may be provided for assembling a computing device with a combined bezel and bumper. The method may include preparing a base for the computing device, and the base may be configured for including internal circuitry including at least one processor and at least one memory. The method may include coupling a display for the computing device to the base for pivotal movement between an open position and closed position, and the display may include an enclosure having an interior side surface and an exterior side surface opposite the interior side surface. The method may include coupling a panel to a central region of the interior side surface of the enclosure of the display, and the panel may include an electronic visual display. The method may include forming a bezel with interior and exterior side surfaces, and the exterior side surface may include at least one bumper protrusion integrated as a part thereof. The method may include applying a malleable coating to the at least one bumper protrusion, and the malleable coating may be configured to contact the base when the display is in the closed position. The method may include coupling the bezel to a peripheral region of the interior side surface of the enclosure of the display so as to overlap at least a portion of the electronic visual display. The interior side surface of the bezel may be configured to cover the peripheral region of the interior side surface of the enclosure with the overlapped portion of the electronic visual display interposed between the enclosure and the bezel.

In accordance with aspects of the disclosure, an apparatus may include a combined bezel and bumper. The apparatus may include internal circuitry including at least one processor and at least one memory. The apparatus may include a base enclosure formed to include the internal circuitry. The apparatus may include a display enclosure formed to include an electronic visual display panel positioned centrally on an interior region of the display enclosure. The display enclosure may be pivotally coupled to the base and configured for movement between an open position and closed position. The display enclosure may include a bezel coupled to a periphery of the display enclosure so as to overlap at least a portion of the electronic visual display panel. The bezel may include an interior side surface that covers the periphery of the display enclosure with the overlapped portion of the electronic visual display panel interposed between the display enclosure and the bezel. The bezel may include an exterior side surface with at least one bumper feature integrated as a part of the exterior side surface and protruding from the exterior side surface. The at least one bumper feature may include a malleable coating that contacts the base enclosure when the display enclosure is in the closed position.

The details of one or more implementations are set forth in the accompanying drawings and the description below. Other features will be apparent from the description and drawings, and from the claims.

BRIEF DESCRIPTION OF THE DRAWINGS

FIGS. 1A-1C are diagrams illustrating example computing devices having base and display enclosures, in accordance with aspects of the disclosure.

DETAILED DESCRIPTION

In accordance with aspects of the disclosure, computing devices such as laptops may include a base enclosure configured with internal circuitry including at least one processor and at least one memory, and the computing devices may further include a display enclosure pivotally coupled to the base enclosure and configured for movement between an open position and closed position. The computing devices may utilize a bezel configured to couple to the display enclosure to hide wiring and other components of an electronic visual display, such as a liquid crystal display (LCD). The bezel may further include a bumper to protect the LCD when the display enclosure is moved to the closed position. In an aspect of the disclosure, the bezel and the bumper may be combined to provide a clean aesthetic look and further to improve manufacturing efficiency by integrating the bumper with the bezel so as to reduce a number of separate parts.

Figure 1A:
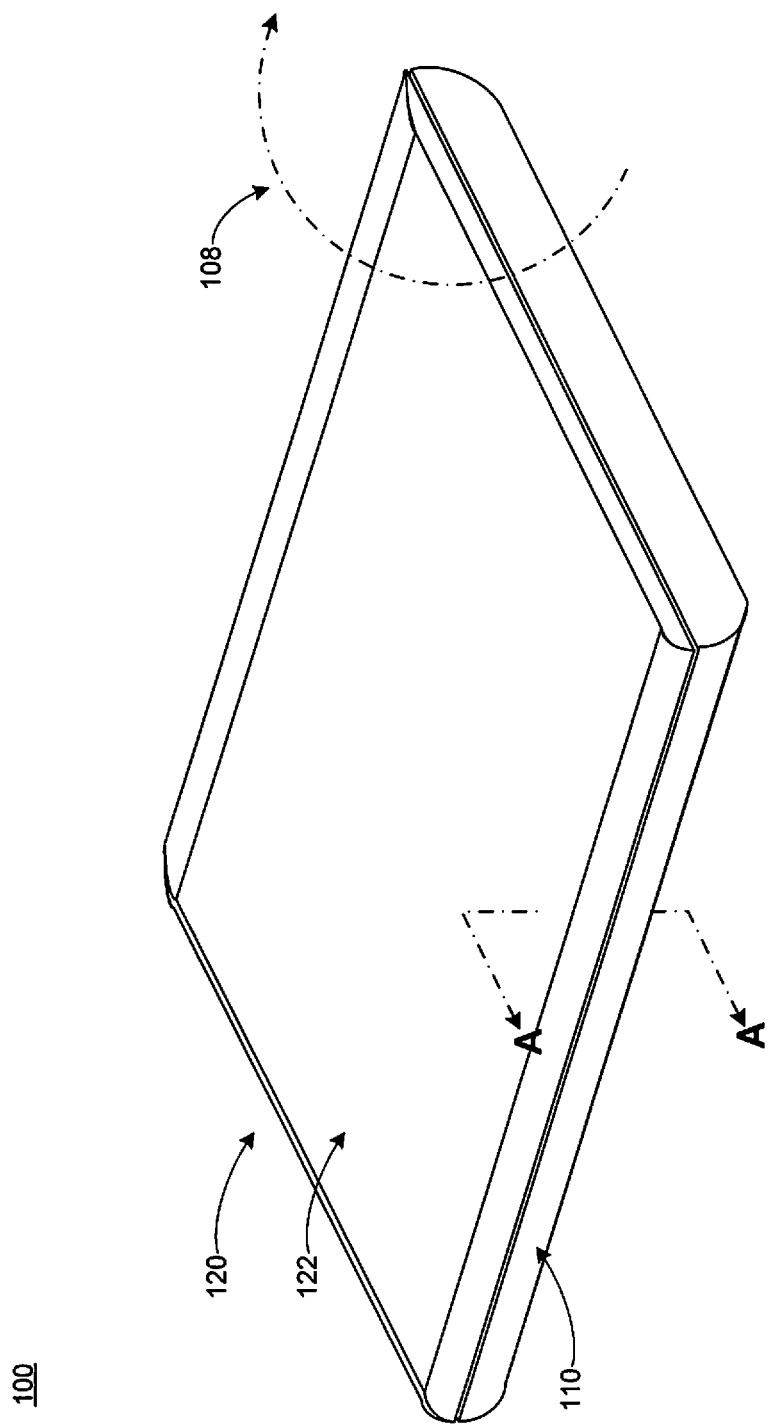
Figure 1B:
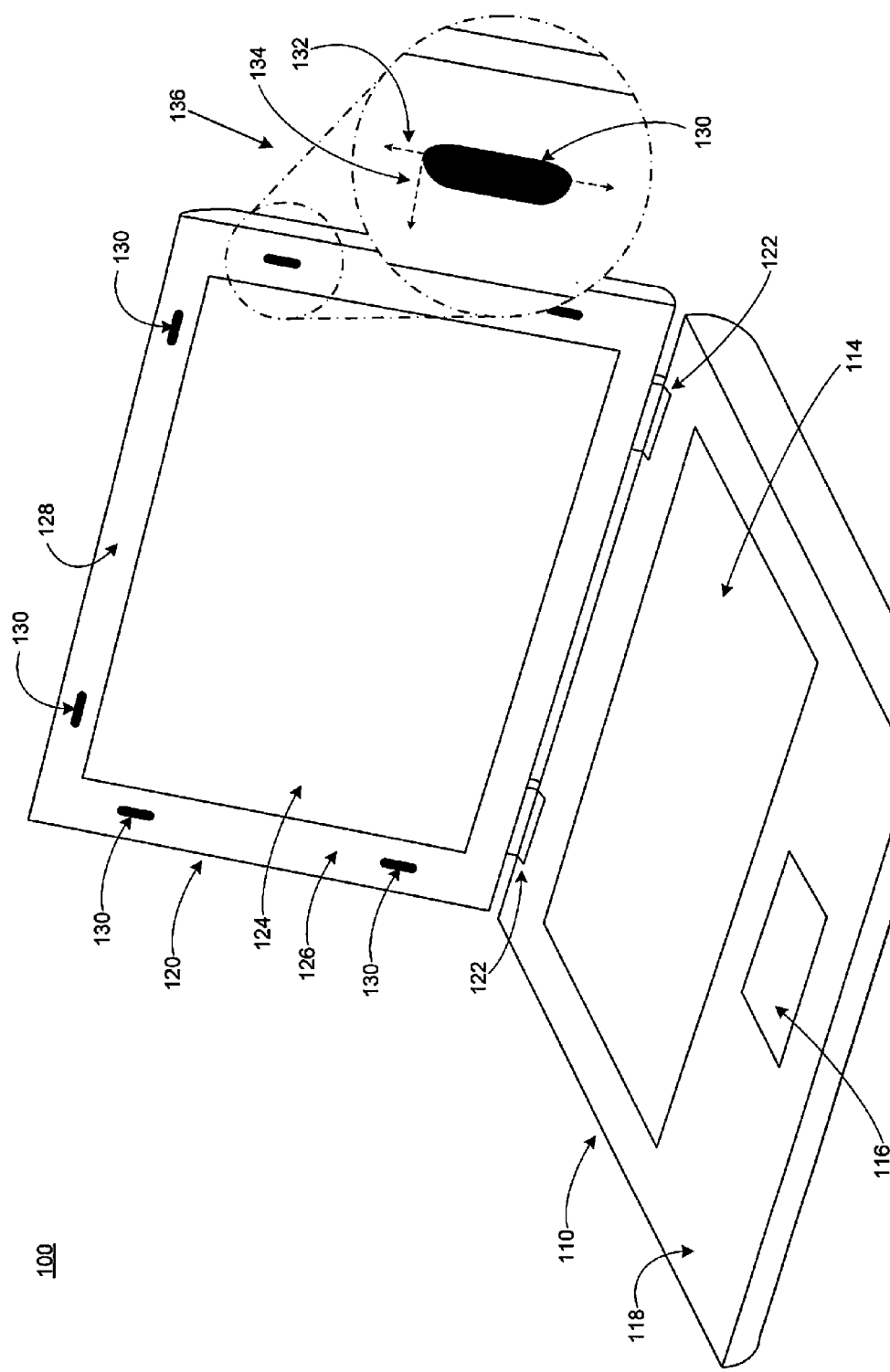

FIGS. 1A-1C are diagrams illustrating example computing devices having base and display enclosures, in accordance with aspects of the disclosure.

In particular, FIGS. 1A-1B illustrate an example device or apparatus 100, such as a computing device or apparatus. For example, the computing device 100 may include a portable computing device including a laptop. The device 100 may include a base enclosure 110 configured to include and/or retain internal circuitry including at least one processor and at least one memory. Further, the device 100 may include a display enclosure 120 pivotally coupled to the base enclosure 110 with one or more hinges 122 and configured for movement 108 between a closed position (e.g., as shown in FIG. 1A) and an open position (e.g., as shown in FIG. 1B). As shown in the example of FIG. 1B, the base enclosure 110 may include one or more user interfaces, such as, for example, a first user interface 114 and a second user interface 116 including at least one of a keyboard and a touch sensor (e.g., touch pad, a trackpad, etc.). In another example, the computing device 100 may include a mobile phone.

The display enclosure 120 may include a panel 124 coupled to an interior of the display enclosure 120. The panel 124 may include at least one electronic visual display, such as an LCD. The display enclosure 120 may include a bezel 126 coupled to a peripheral region of the interior of the display enclosure 120 so as to overlap at least a portion of the panel 124 (e.g., electronic visual display, such as an LCD). The bezel 126 may be configured to hide or cover the peripheral region of the interior of the display enclosure 120 with the overlapped portion of the panel 124 interposed between the display enclosure 120 and the bezel 126. The bezel 126 may include an exterior side surface 128 with at least one bumper protrusion 130 integrated as a part (e.g., formed from a single material or monolithically formed) of the exterior side surface 128.

As described herein, the at least one bumper protrusion 130 may include a malleable coating (e.g., a layer of material formed over an outer surface of the at least one bumper protrusion 130 including an elastic material, such as, for example, at least one of rubber, silicone, plastic, and polymer) that contacts an interior side surface 118 of the base enclosure 110 when the display enclosure 120 is in the closed position. In some examples, the panel 124 of the display enclosure 120 may be referred to as a third user interface including at least one of an electronic visual display (e.g., LCD), a touch-screen display (e.g., touch-screen LCD), a touch sensor, a touch pad, a trackpad.

In the examples of FIGS. 1B-1C, the bezel 126 may be formed as a frame that extends around a periphery of the panel 124 to hide or cover exposed areas of the panel 124 between the electronic visual display and an outward periphery of the display enclosure 120. In various examples, the bezel 126 may be formed, entirely or at least in part, of one or more of polymer, plastic, resin, rubber, aluminum, titanium, magnesium, chromoly, stainless steel. In various other examples, the bezel 126 may be coupled to the display enclosure 120 with at least one of a bonding agent, an adhesive, solder, and at least one fastener including at least one of a screw, a rivet, an anchor, and a snaplock.

As shown in FIG. 1B, the at least one bumper protrusion 130 may protrude or extend from the exterior side surface 128 of the bezel 126. For instance, as shown in an expanded view 136, the at least one bumper protrusion 130 may be aligned along a first line 132 (or axis) that is parallel to the exterior side surface 128 of the bezel 126. Further, in this example, as shown in the expanded view 136, the at least one bumper protrusion 130 may protrude or extend away from the exterior side surface 128 of the bezel 126 along a second line 134 that is orthogonal to the first line 132. In an example, the at least one bumper protrusion 130 may include a plurality of bumper protrusions 130 positioned around the exterior side surface 128 of the bezel 126. In some examples, the one or more bumper protrusions 130 may be aligned along the first line 132 (or axis) in a non-parallel, irregular, or random manner with the exterior side surface 128 of the bezel 126. In some other examples, the one or more bumper protrusions 130 may include various shapes and/or contours including regular and irregular shapes and/or contours, such as, for example, curved, round, square, rectangular, triangular, macaroni shapes, etc.

As shown in an expanded view 146 of FIG. 1C, the at least one bumper protrusion 130 may include another bumper protrusion 140 configured to extend in a continuous line around the bezel 126. In this example, the bumper protrusion 140 may protrude or extend from the exterior side surface 128 of the bezel 126. Further, the at least one bumper protrusion 140 may be aligned along a first line 142 (or axis) that is parallel to the exterior side surface 128 of the bezel 126. Further, in this example, the at least one bumper protrusion 140 may protrude or extend away from the exterior side surface 128 of the bezel 126 along a second line 144 that is orthogonal to the first line 142. In various examples, the at least one bumper protrusion 130 may be aligned along the first line 142 (or axis) in a non-parallel, irregular, or random manner with the exterior side surface 128 of the bezel 126. Further, in some other examples, the at least one bumper protrusion 140 may include various shapes and/or contours including regular and irregular shapes and/or contours, such as, for example, curved, round, square, rectangular, triangular, macaroni shape, etc.

In reference to FIGS. 1B-1C, a malleable coating may be applied to the bumper protrusions 130, 140. In various examples, the malleable coating may include at least one layer of material formed over an outer surface of the bumper protrusions 130, 140 including an elastic material, such as, for example, at least one of rubber, silicone, plastic, and polymer. In some other examples, the malleable coating may include multiple layers of a same material or different materials.

In the various examples of FIGS. 1A-1C, the enclosures 110, 120 of the device 100 may be referred to as housings or any type of structure that may be used as an enclosure and/or a housing. In these examples, the enclosures 110, 120 may be formed to include and define one or more interior and exterior side surfaces of the device 100 and one or more other exterior top and/or bottom surfaces of the device 100.

FIGS. 2A-2D are block diagrams illustrating cross-sectional views of the example computing device of FIG. 1A taken along the line A-A, in accordance with aspects of the disclosure.

As described herein, the device 100 may include the base enclosure 110 configured to include internal circuitry 112 including at least one processor and at least one memory. The device 100 may include the display enclosure 120 pivotally coupled to the base enclosure 110 and configured for movement between open and closed positions, as shown in FIGS. 1A-1B. The display enclosure 120 may include an exterior side surface 125 and an interior side surface 127 opposite the exterior side surface 125. The display enclosure 120 may include the panel 124 (e.g., electronic visual display) coupled to a central region 127a of the interior side surface 127 of the display enclosure 120.

Further, the display enclosure 120 may include the bezel 126 coupled to a peripheral region 127b of the interior side surface 127 of the display enclosure 120 so as to overlap at least a portion of the panel 124 (e.g., electronic visual display). The bezel 126 may include an interior side surface 129 that covers the peripheral region 127b of the interior side surface 127 of the display enclosure 120 with the overlapped portion of the panel 124 (e.g., electronic visual display) interposed between the display enclosure 120 and the bezel 126. The bezel 126 may include the exterior side surface 128 with at least one bumper protrusion 130 integrated as a part (e.g., formed from a single material or monolithically formed) of the exterior side surface 128 of the bezel 126. The at least one bumper protrusion 130 may include a malleable coating (e.g., a layer of material formed over an outer surface of the at least one bumper protrusion 130 including an elastic material, such as, for example, at least one of rubber, silicone, plastic, and polymer) that, for example, makes contact with the interior side surface 118 of the base enclosure 110 when the display enclosure 120 is in the closed position.

In an example, the exterior side surface 128 of the bezel 126 may include the malleable coating over its entirety (or over at least part of) including the at least one bumper protrusion 130. In another example, the bezel 126 may be formed of at least one of a plastic material or polymer material with the entire exterior side surface 128 having the malleable coating including the at least one bumper protrusion 130. In various examples, the malleable coating may include an elastic material including at least one of rubber, silicone, plastic, and polymer.

In various examples, one or more bumper protrusions 130 may be formed or positioned on one or more sides of the bezel 126, such as, for example, around a top side and one or more other sides and not on a bottom side of the bezel 126. In another example, one or more bumper protrusions 130 may be formed or positioned on a top half of the bezel 126. In other examples, one or more sets (e.g., multiple different sets) of one or more bumper protrusions 130 may be formed or positioned around the bezel 126 in a parallel, non-parallel, irregular, or random manner. In still other examples, one or more bumper protrusions 130 may be formed on an interior surface of the base enclosure 110 to contact the display enclosure 120 when in the closed position. In reference to this example and other examples described herein, the one or more bumper protrusions 130 may be formed on the base enclosure 110 instead of or in addition to the one or more bumper protrusions 130 formed on the display enclosure 120.

Figure 2A:
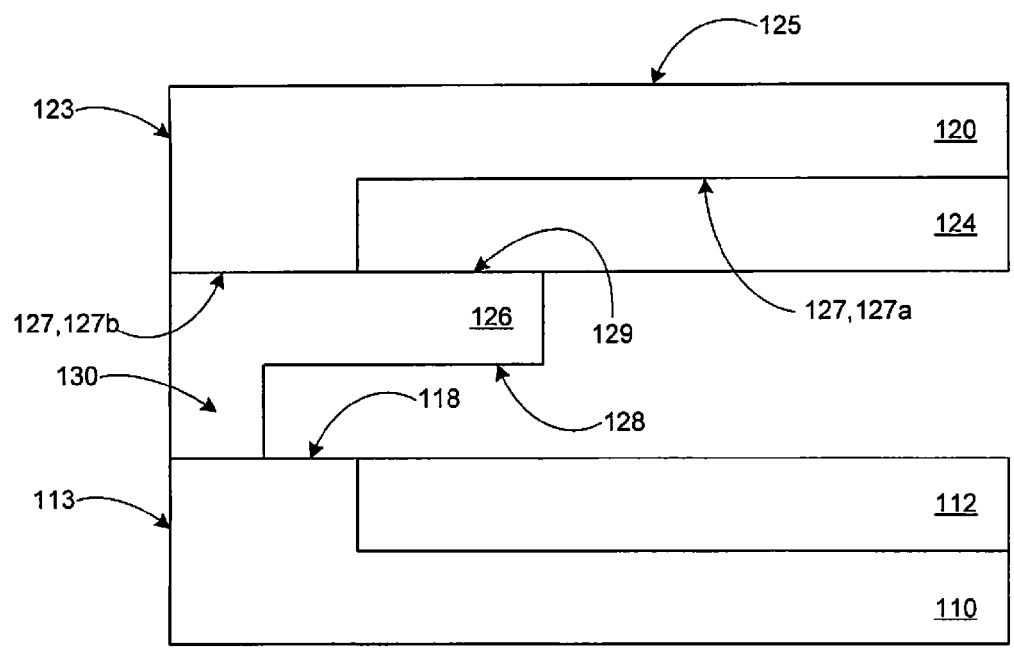
FIGS. 2A-2D are block diagrams illustrating cross-sectional views of the example computing device of FIG. 1A, in accordance with aspects of the disclosure.

As shown in the example of FIG. 2A, the bumper protrusion 130 may be positioned at an outer edge of the bezel 126 so as to be aligned with an outer side surface 113 of the base enclosure 110 and an outer side surface 123 of the display enclosure 120.

Figure 2B:
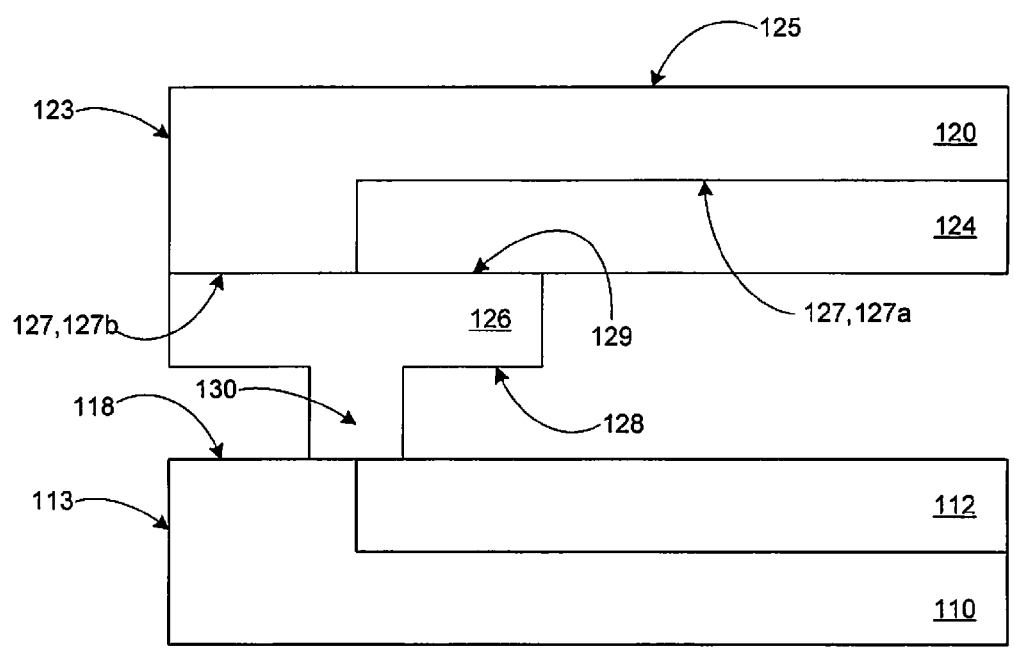

As shown in the example of FIG. 2B, the bumper protrusion 130 may be positioned in a central region of the bezel 126 so as to be positioned away from the outer side surfaces 113, 123 of the base and display enclosures 110, 120, respectively.

In various implementations, the one or more bumper protrusions 130 may include any particular or desirable thickness or range of thicknesses. For example, the bumper protrusion 130 may include a thickness of about 1 mm. In other examples, the bumper protrusion 130 may include a thickness within a range of thicknesses, such as within a range of 1 to 3 mm (millimeter) or within in a range of 0.5 mm to 4.5 mm. In other various examples, the thickness may include any thickness or range of thicknesses that may be used to form the structure of the one or more bumper protrusions 130.

In various other implementations, the one or more bumper protrusions 130 may include any particular or desirable width, height, length, and/or thickness or range of widths, heights, lengths, and/or thicknesses and/or any other relevant dimensions. For example, the bumper protrusion 130 may include a width of about 5 mm, a length of about 20 mm, and a thickness of about 2 mm. In another example, the bumper protrusion 130 may include a width of about 1 mm, a height of about 1 mm, and a thickness of about 1 mm. In another example, when the bumper protrusion 130 includes a continuous line around the bezel 126, the length of the bumper protrusion 130 may include a length similar to the dimensions of a perimeter of the bezel 126, such as about 1 m (meter) or less than 1 m or greater than 1 m (e.g., the 1 meter length may refer to a length of the continuous line bumper protrusion 140 that extends around a perimeter of the bezel 126, for instance, as shown in the example of FIG. 1C). In some other examples, the bumper protrusion 130 may include a width within a ranges of widths, such as within a range of 0.5 to 8 mm, a height or depth within a range of heights or depths, such as within a range of 0.5 to 35 mm, and a thickness within a ranges of thicknesses, such as within a range of 0.5 to 5 mm. In other various examples, the dimensions of the one or more bumper protrusions 130 may include any width, height, length, and/or thickness or range of widths, heights, lengths, and/or thicknesses and/or any other relevant dimensions that may be used to form the structure of the one or more bumper protrusions 130.

Figure 2C:
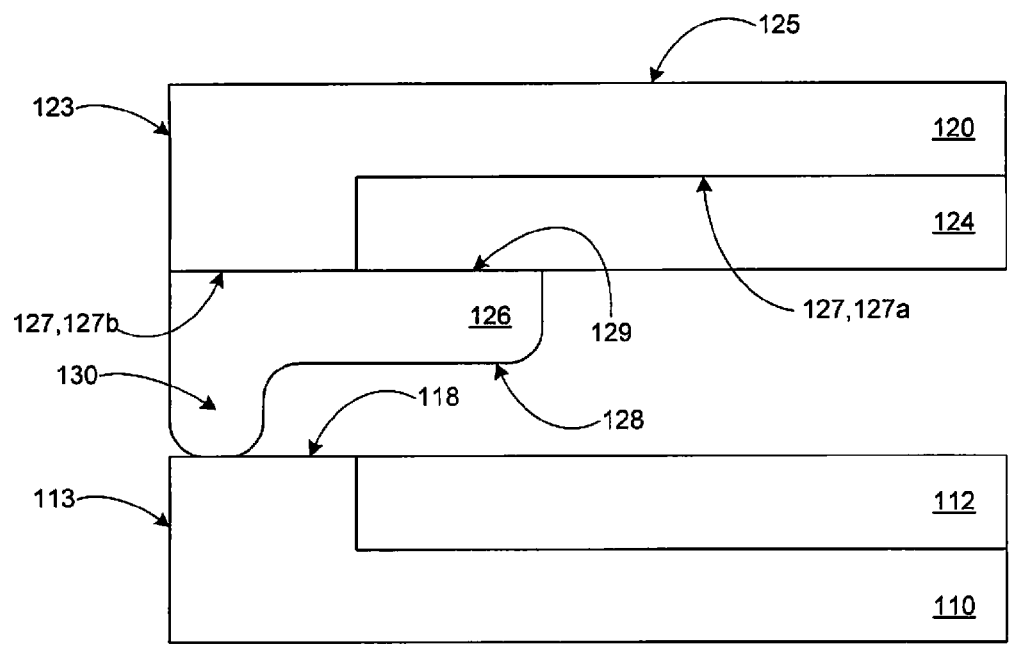
Figure 2D:
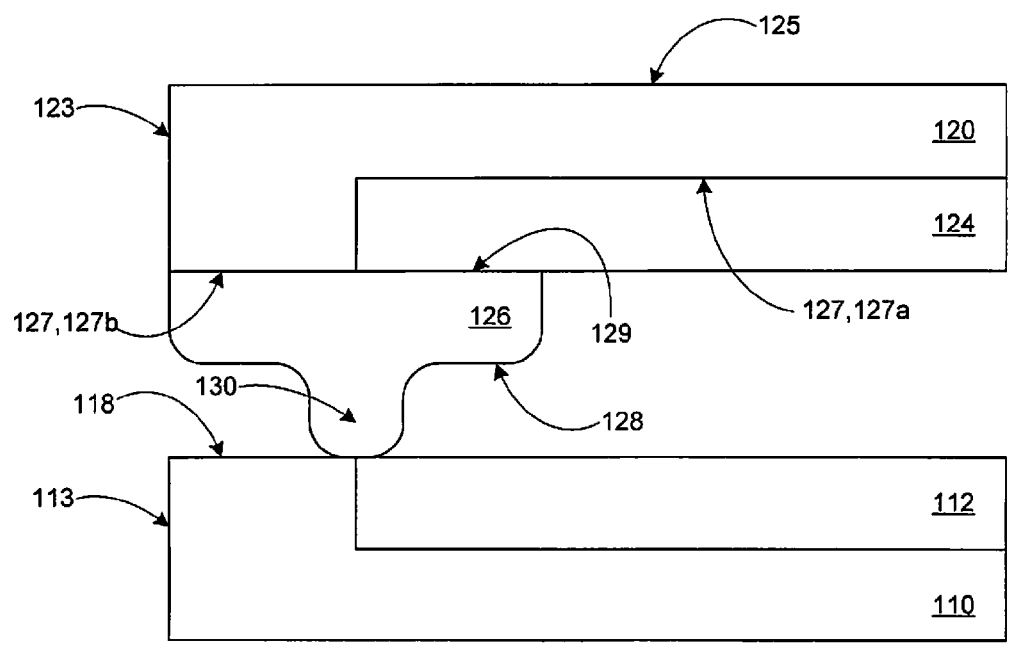

As shown in the example of FIGS. 2C-2D, the bezel 126 and/or bumper protrusion 130 may include contoured profiles with the bumper protrusion 130 protruding from the exterior side surface 128 of the bezel 126. In particular, the description related to the example combined bezel 126 and bumper protrusion 130 of FIG. 2A may be applied to the contoured example of the combined bezel 126 and bumper protrusion 130 in FIG. 2C, and the description related to the example combined bezel 126 and bumper protrusion 130 of FIG. 2B may be applied to the contoured example of the combined bezel 126 and bumper protrusion 130 in FIG. 2D.

In various examples, one or more bumper protrusions 130 may be formed or positioned at an outer edge of the bezel 126, in a central region of the bezel 126, at an inner edge of the bezel 126, or some combination thereof. In various other examples, multiple bumper protrusions 130 may be formed or positioned anywhere on the bezel 126 and may include a mixture of the configurations of the combined bezel 126 and bumper protrusions 130 shown in FIGS. 2C and 2D. For example, the arrangement of combined bezel 126 and bumper protrusions 130 formed on the bezel 126 may include a mixture of the examples shown in FIG. 2C on one side of the bezel 126 and the examples shown in FIG. 2D on another side of the bezel 126, or some variation thereof.

FIGS. 3A-3H are block diagrams illustrating an example assembly of a display enclosure, in accordance with aspects of the disclosure.

Figure 3A:
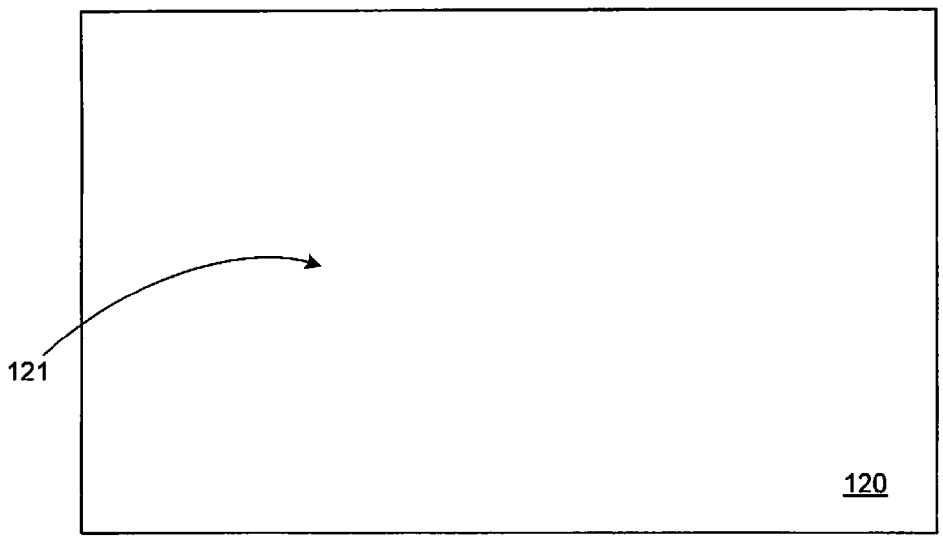
FIGS. 3A-3H are block diagrams illustrating an example assembly of a display enclosure, in accordance with aspects of the disclosure.

In particular, FIG. 3A is a block diagram illustrating the example display enclosure 120 for the example device 100 or apparatus, such as a computing device or apparatus. In various examples, the display enclosure 120 may be referred to as a housing and/or an enclosure including any type of structure that may be used as a housing and/or an enclosure. In an example, the display enclosure 120 may be formed to include and define one or more exterior side surfaces of the device such that the housing and/or enclosure provided by the display enclosure 120 may include and define multiple exterior side surfaces and at least one exterior bottom surface of the device.

In an example, the display enclosure 120 may be formed as a receptacle (e.g., bucket, container, etc.) with a recessed area 121 defining an interior region (e.g., space, cavity, compartment, etc.) configured for receiving an electronic visual display, such as the panel 124 with an LCD mounted thereto. As such, in reference to the display enclosure 120 being formed as a receptacle, bucket, container, etc., the display enclosure 120 may include four sidewalls that couple together to form a rectangular structure and further to form a depth or thickness to define the interior region, area, space, cavity, compartment, etc. In this example, the display enclosure 120 may include an upper sidewall that spans the rectangular area of the display enclosure 120 to thereby define the receptacle, bucket, container, etc. structure of the base member 100. Further, in this example, the receptacle structure of the base member 100 including the four sidewalls may include the interior side surfaces 127, 127a, 127b and the exterior side surface 125 such that the housing and/or enclosure provided by the display enclosure 120 includes and defines exterior side surfaces and an upper sidewall surface of the device 100.

Figure 3B:
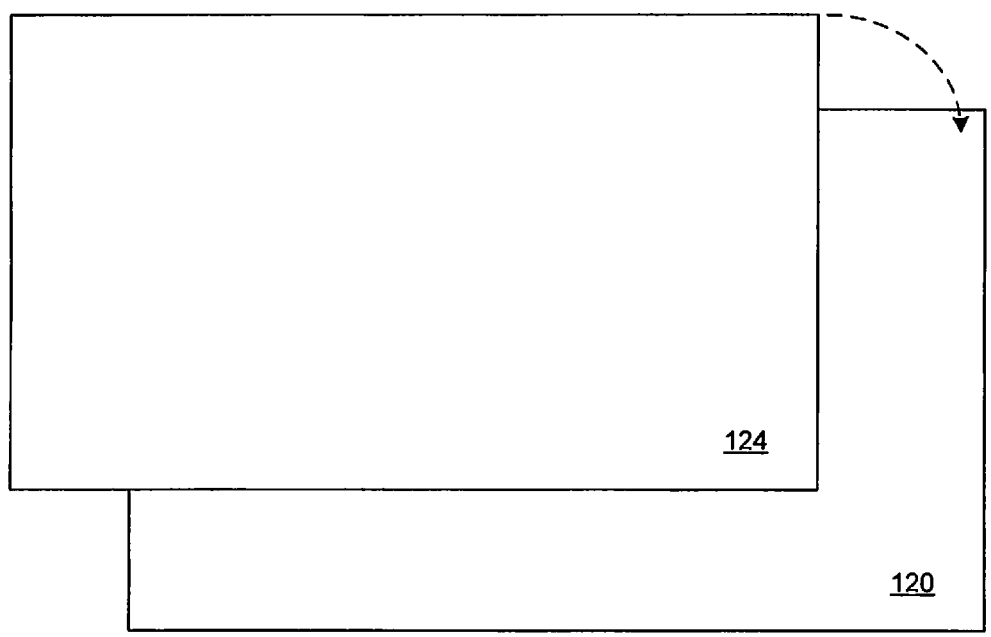

FIG. 3B is a block diagram illustrating the example panel 124 (e.g., electronic visual display, such as an LCD) being coupled to (e.g., assembled to) the display enclosure 120. The display enclosure 120 may include the panel 124 coupled to a central region of the interior side surface of the display enclosure 120. In an example, the panel 124 may include an electronic visual display, such as an LCD.

Figure 3C:
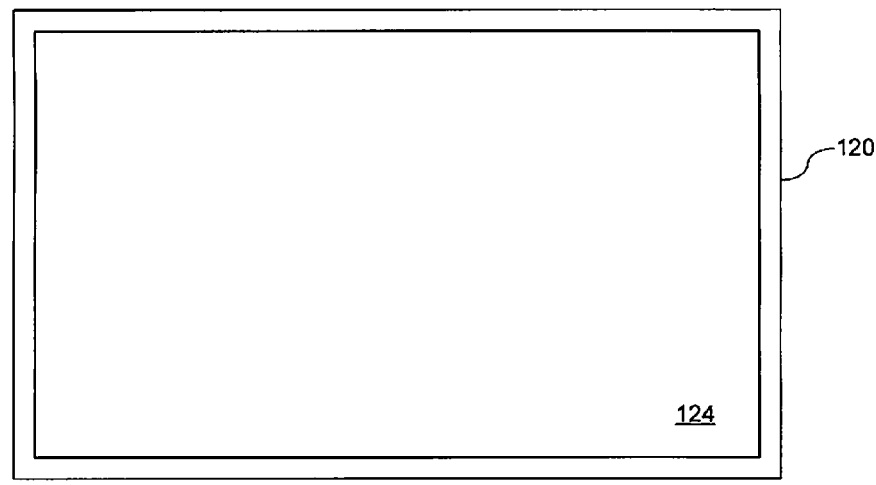

FIG. 3C is a block diagram illustrating the example panel 124 coupled to the display enclosure 120. In an implementation, the coupling of the panel 124 to the display enclosure 120 may be referred to as an assembly of the display enclosure 120 and the panel 124. In various examples, the panel 124 may be coupled to the display enclosure 120 with at least one of a bonding agent, an adhesive, solder, and at least one fastener including at least one of a screw, a rivet, an anchor, and a snaplock.

Figure 3D:
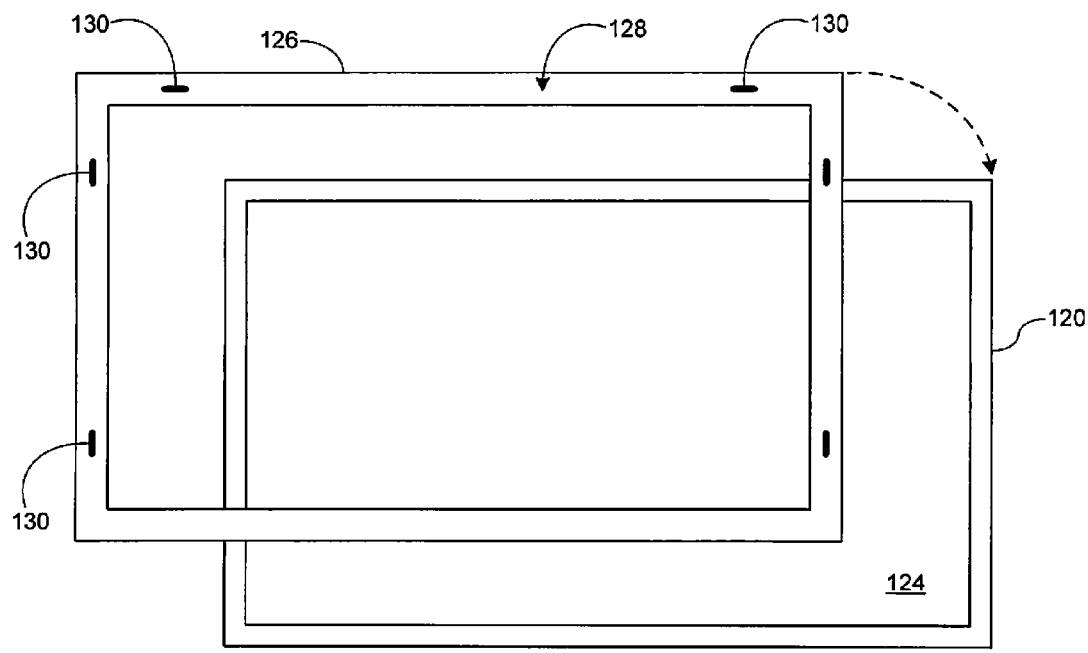

FIG. 3D is a block diagram illustrating the example bezel 126 being coupled to (e.g., assembled to) the display enclosure 120. The bezel 126 may be coupled to the peripheral region 127a of the display enclosure 120 so as to overlap a portion of the panel 124 (e.g., electronic visual display). The bezel 126 may be configured to cover the peripheral region 127a of the display enclosure 120 with the overlapped portion of the panel 124 (e.g., electronic visual display) interposed between the display enclosure 120 and the bezel 126. The bezel 126 may include the exterior side surface 128 with one or more bumper protrusions 130 integrated as a part of the bezel 126. In various examples, the one or more bumper protrusions 130 may be monolithically formed as part of the bezel 126, such as formed from a single material. As described herein, the one or more bumper protrusions 130 may include a malleable coating that contacts the base enclosure 110 when the display enclosure 120 is in the closed position. In various examples, the malleable coating may include at least one layer of material formed over an outer surface of the one or more bumper protrusions 130 including an elastic material, such as, for example, at least one of rubber, silicone, plastic, polymer, etc.

Figure 3E:
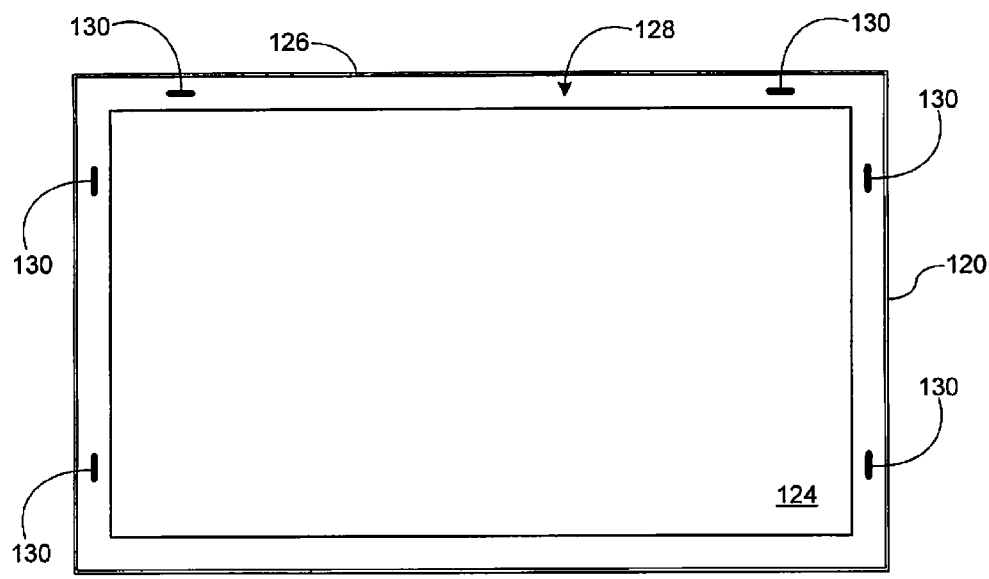

FIG. 3E is a block diagram illustrating the bezel 126 coupled to the display enclosure 120. In an implementation, the bezel 126 may include one or more integrated bumper protrusions 130, and the coupling of the bezel 126 to the display enclosure 120 may be referred to as an assembly of the bezel 126 and the display enclosure 120. As shown in FIG. 3E, the bezel 126 may be formed as a frame that extends around the panel 124 to cover exposed areas of the panel 124 between the electronic visual display and outward periphery of the display enclosure 120. The bezel 126 may be coupled to the display enclosure 10 with at least one of a bonding agent, an adhesive, solder, and at least one fastener including at least one of a screw, a rivet, an anchor, and a snaplock.

In an example, the bezel 126 may be formed of a plastic material with at least a portion of the exterior side surface 128 having a malleable coating including the one or more bumper protrusions 130. In another example, the bezel 126 may be formed of at least one of aluminum, titanium, magnesium, chromoly, stainless steel, polymer, plastic, resin, and rubber. In another example, the malleable coating may include an elastic material including at least one of rubber, silicone, plastic, and polymer.

Figure 3F:
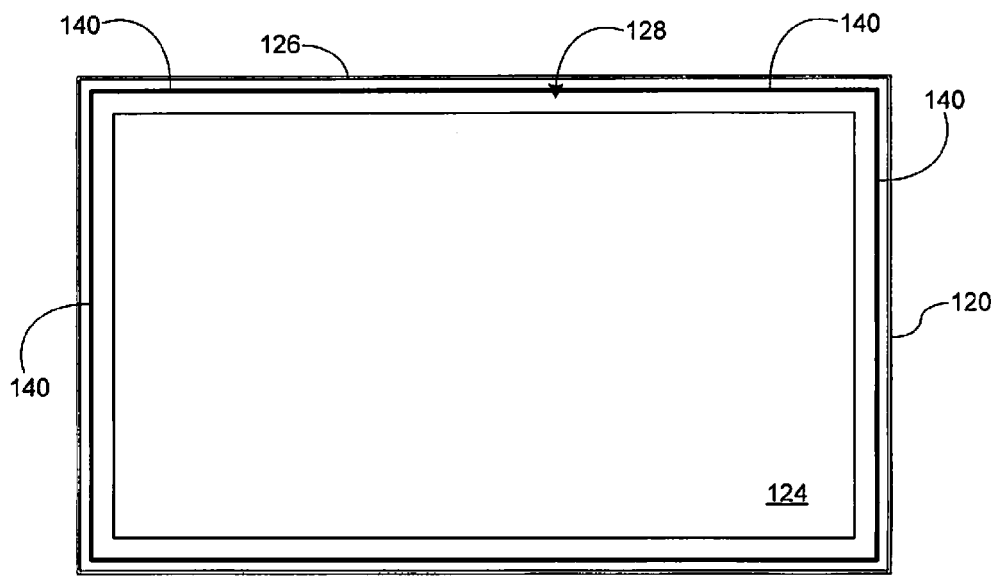

FIG. 3F is another block diagram illustrating the bezel 126 coupled to the display enclosure 120. In an implementation, as shown in FIG. 3F, the bezel 126 may include at least one integrated bumper protrusion 140 that is configured to extend in a continuous line around the bezel 126, and similar to FIG. 3E, the coupling of the bezel 126 to the display enclosure 120 may be referred to as an assembly of the bezel 126 and the display enclosure 120.

Figure 3G:
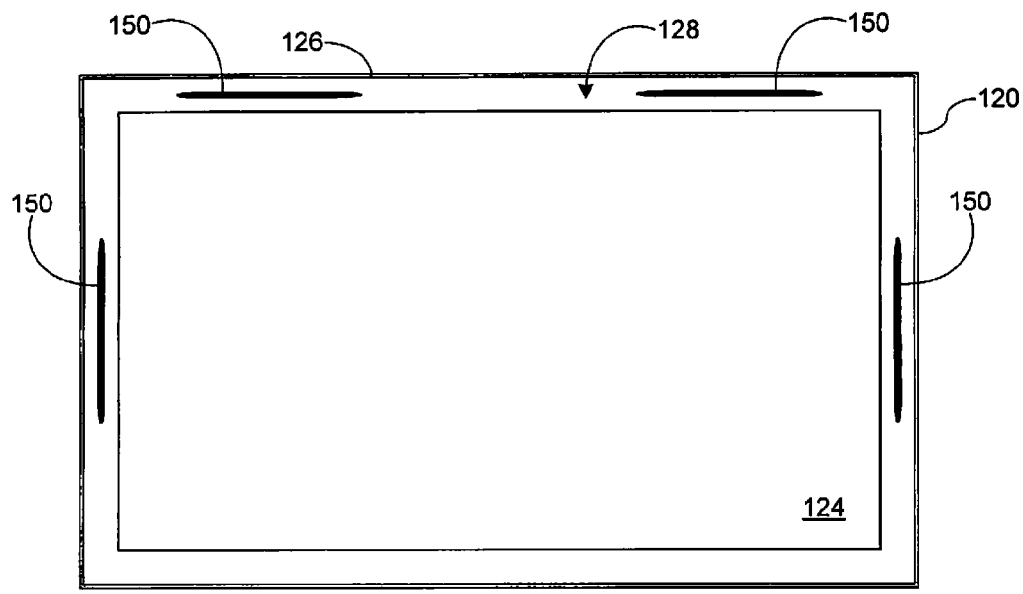

FIG. 3G is another block diagram illustrating the bezel 126 coupled to the display enclosure 120. In an implementation, as shown in FIG. 3G, the bezel 126 may include one or more integrated bumper protrusions 150 having an elongated dimension (e.g., an elongated length) that is configured to extend across the bezel 126 over a greater distance than the example bumper protrusion 130 of FIG. 3E. Further, similar to FIG. 3E, the coupling of the bezel 126 to the display enclosure 120 may be referred to as an assembly of the bezel 126 and the display enclosure 120.

Figure 3H:
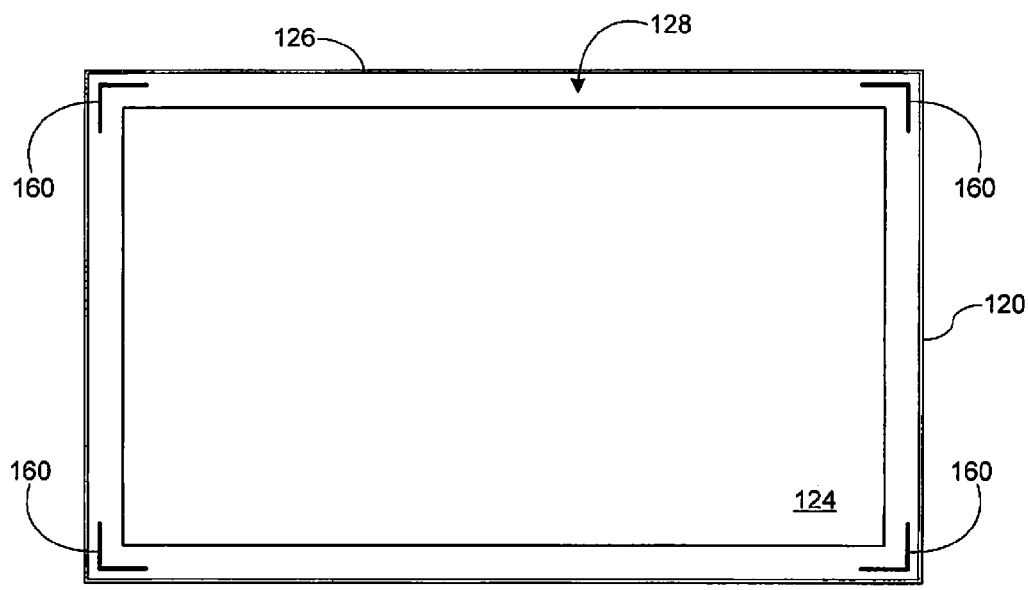

FIG. 3H is another block diagram illustrating the bezel 126 coupled to the display enclosure 120. In an implementation, as shown in FIG. 3H, the bezel 126 may include one or more integrated bumper protrusions 160 having an elongated dimension (e.g., an elongated length) that is configured to extend in a continuous line around one or more corners of the bezel 126. In an example, as shown in FIG. 3H, the one or more integrated bumper protrusions 160 may be configured to extend across the bezel 126 over a greater distance than the example bumper protrusion 130 of FIG. 3E. Further, similar to FIG. 3E, the coupling of the bezel 126 to the display enclosure 120 may be referred to as an assembly of the bezel 126 and the display enclosure 120.

In an example, the bezel 126 may be formed of a plastic material with at least a portion of the exterior side surface 128 having a malleable coating including the at least one bumper protrusion 140. In another example, the bezel 126 may be formed of at least one of aluminum, titanium, magnesium, chromoly, stainless steel, polymer, plastic, resin, and rubber. In another example, the malleable coating may include an elastic material including at least one of rubber, silicone, plastic, and polymer.

As described herein in reference to FIGS. 1A-3H, aspects of the disclosure provide an apparatus that may include internal circuitry including at least one processor and at least one memory. The apparatus may include a base enclosure formed to include the internal circuitry and a display enclosure formed to include an electronic visual display panel positioned centrally on an interior region of the display enclosure. The display enclosure may be pivotally coupled to the base and configured for movement between an open position and closed position. The display enclosure may include a bezel coupled to a periphery of the display enclosure so as to overlap at least a portion of the electronic visual display panel. The bezel may include an interior side surface that covers the periphery of the display enclosure with the overlapped portion of the electronic visual display panel interposed between the display enclosure and the bezel. The bezel may include an exterior side surface with at least one bumper feature integrated as a part (e.g., formed from a single material or monolithically formed) of the exterior side surface and protruding from the exterior side surface. The at least one bumper feature may include a malleable coating that contacts the base enclosure when the display enclosure is in the closed position. In various examples, the malleable coating may include at least one layer of material formed over an outer surface of the at least one bumper feature including an elastic material, such as, for example, at least one of rubber, silicone, plastic, polymer, etc.

Figure 4:
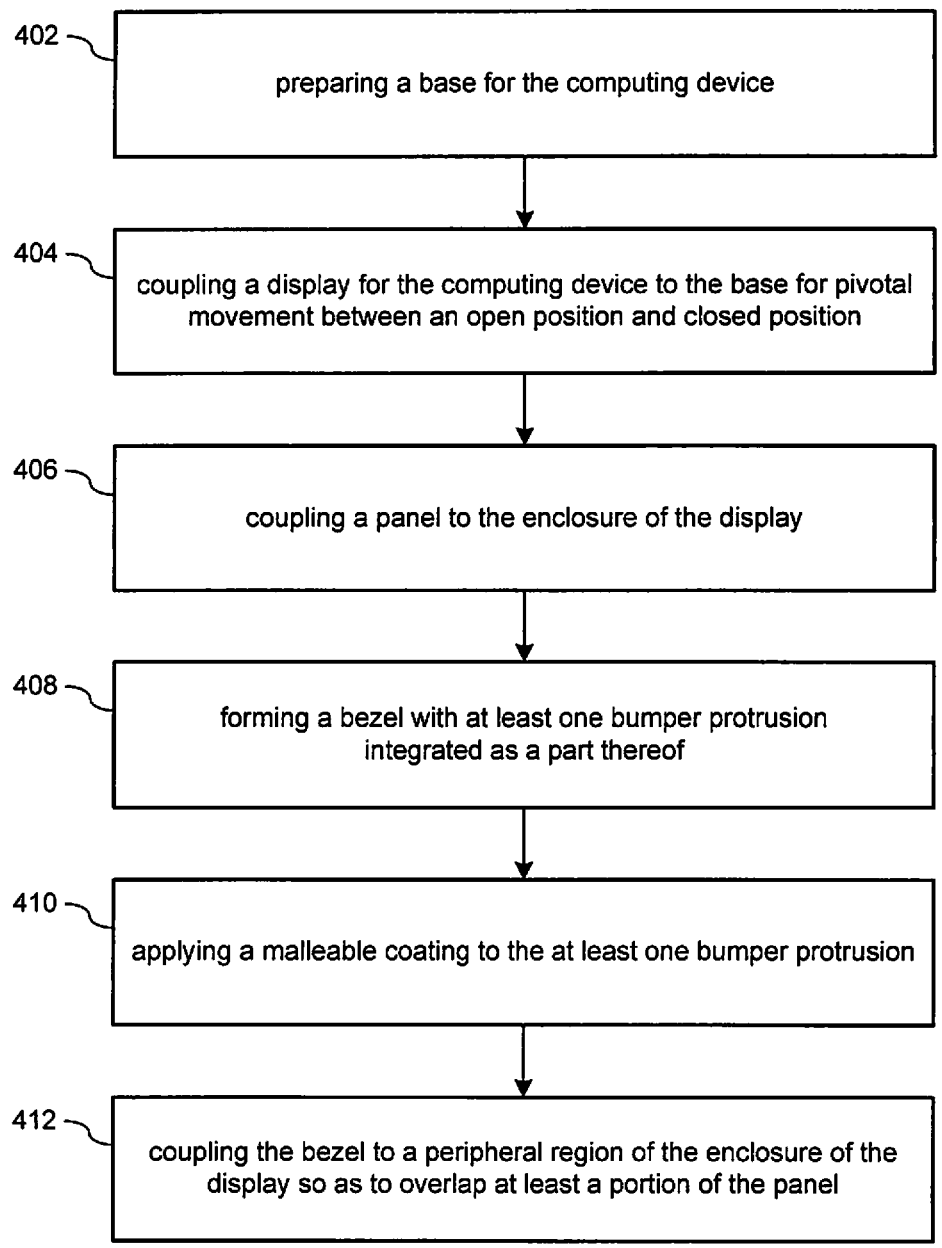
FIG. 4 is a process flow illustrating an example method for assembling an example device, in accordance with aspects of the disclosure.

FIG. 4 is a process flow illustrating an example method for assembling an example device (e.g., a computing device) with torsional housing rigidity, in accordance with aspects of the disclosure.

In the example of FIG. 4, operations 402-412 are illustrated as discrete operations occurring in sequential order. However, in other implementations, two or more of the operations 402-412 may occur in a partially or completely overlapping or parallel manner, or in a nested or looped manner, or may occur in a different order than that shown. Further, one or more additional operations, that may not be specifically illustrated in the example of FIG. 4, may also be included in some implementations, while in other implementations, one or more of the operations 402-412 may be considered optional or omitted.

In the example of FIG. 4, at 402, the method 400 may include preparing a base (i.e., base enclosure) for the device. In an example, the base may be configured for including internal circuitry including at least one processor and at least one memory.

At 404, the method 400 may include coupling a display for the device to the base for pivotal movement between an open position and closed position. In an example, the display may include an enclosure having an interior side surface and an exterior side surface opposite the interior side surface.

At 406, the method 400 may include coupling a panel to a central region of the interior side surface of the enclosure of the display. In an example, the panel may include an electronic visual display, such as an LCD.

At 408, the method 400 may include forming a bezel with interior and exterior side surfaces. In an example, the bezel may be formed with at least one bumper protrusion integrated as a part thereof (e.g., monolithically formed as part thereof), and the exterior side surface of the bezel may include the at least one bumper protrusion extending therefrom. In various examples, the combined bezel and bumper may be formed with one material, or the combined bezel and bumper may be formed with multiple materials. In various examples, the bezel may be formed with one or more materials including one or more polymer, plastic, resin, rubber, aluminum, titanium, magnesium, chromoly, and steel including stainless steel.

In various implementations, the bumper protrusions may be formed with an injection molding technique. For example, the bezel and bumper protrusions may be formed using a mold, where the bezel and bumper protrusions may be combined and formed in one-piece with injection molding. In this example, the combined bezel and bumper protrusion may be formed in a single shot injection molding of Thermoplastic Polyurethane (TPU). In another example, the combined bezel and bumper protrusion may be formed in a double shot injection molding with a first shot for a base including a Polycarbonate-acrylonitrile-butadiene-styrene blend (PC/ABS) or similar plastic material and a second shot coat of the base including TPU. The bumper portion may include a malleable material, such as, for example, TPU or TPE (Thermoplastic Elastomer) or rubber.

At 410, the method 400 may include applying a malleable coating to the at least one bumper protrusion. In an example, the malleable coating may be configured for contacting the base when the display is in the closed position. In various examples, the malleable coating may include an elastic material including at least one of rubber, silicone, plastic, and polymer.

In various implementations, the malleable coating may be applied to the bumper protrusions using various techniques. For example, the malleable coating may be applied to the bumper protrusion with an adhesive or glue. In another example, the malleable coating may be applied to the bumper protrusion with heat or heat sealed with an annealing process. In another example, the malleable coating may be applied to the bumper protrusion using the single shot technique with the combined bezel and bumper structure formed entirely of the malleable material. In another example, the malleable coating may be applied to the bumper protrusion using the double shot technique with the malleable material formed over the structural material of the combined bezel and bumper structure. The single and double shot injection molding techniques provide a reliable means for forming the combined bezel and bumper structure with the malleable coating.

In an implementation, referring to the double-shot method or technique, a stiff or hard material (e.g., plastic material, such as PC/ABS or similar material) may be shot, injected, or disposed into a mold (i.e., mould) first or prior to shooting, injecting, or disposing a soft material (e.g., malleable material, such as TPU, TPE, rubber, or similar material) into the mold (i.e., mould). For example, a stiff plastic material (e.g., PC/ABS or similar material) may be injected first into the mold (i.e., mould), and then a soft malleable material (e.g., TPU, TPE, or similar material such as rubber) may be injected second into the mold (i.e., mould). In various examples, the plastic material may be referred to as resin, pellet, or some other similar term. In another implementation, the double-shot method or technique may be reversed such that, in an example, a soft malleable material (e.g., TPU, TPE, or similar material such as rubber) may be injected first into the mold (i.e., mould), and then a stiff plastic material (e.g., PC/ABS or similar material) may be injected second into the mold (i.e., mould).

At 412, the method 400 may include coupling the bezel to a peripheral region of the interior side surface of the enclosure of the display so as to overlap at least a portion of the electronic visual display. In an example, the interior side surface of the bezel may be configured for covering the peripheral region of the interior side surface of the enclosure with the overlapped portion of the electronic visual display interposed between the enclosure and the bezel.

In an example, the bezel may be formed as a frame that extends around the panel to cover exposed areas of the panel between the electronic visual display and outward periphery of the enclosure of the display. In another example, the bezel may include a contoured profile with the at least one bumper protrusion protruding from the exterior side surface of the bezel. In various examples, the exterior side surface of the bezel may include the malleable coating over only the at least one protrusion or over its entirety including the at least one bumper protrusion.

In an example, the at least one bumper protrusion may include a plurality of bumper protrusions positioned around the exterior side surface of the bezel. In another example, the at least one bumper protrusion may include a bumper protrusion extending in a continuous line around the bezel.

In various examples, the device may include a portable computing device including at least one of a laptop and a mobile phone, and the electronic visual display may include a liquid crystal display (LCD).

Figure 5:
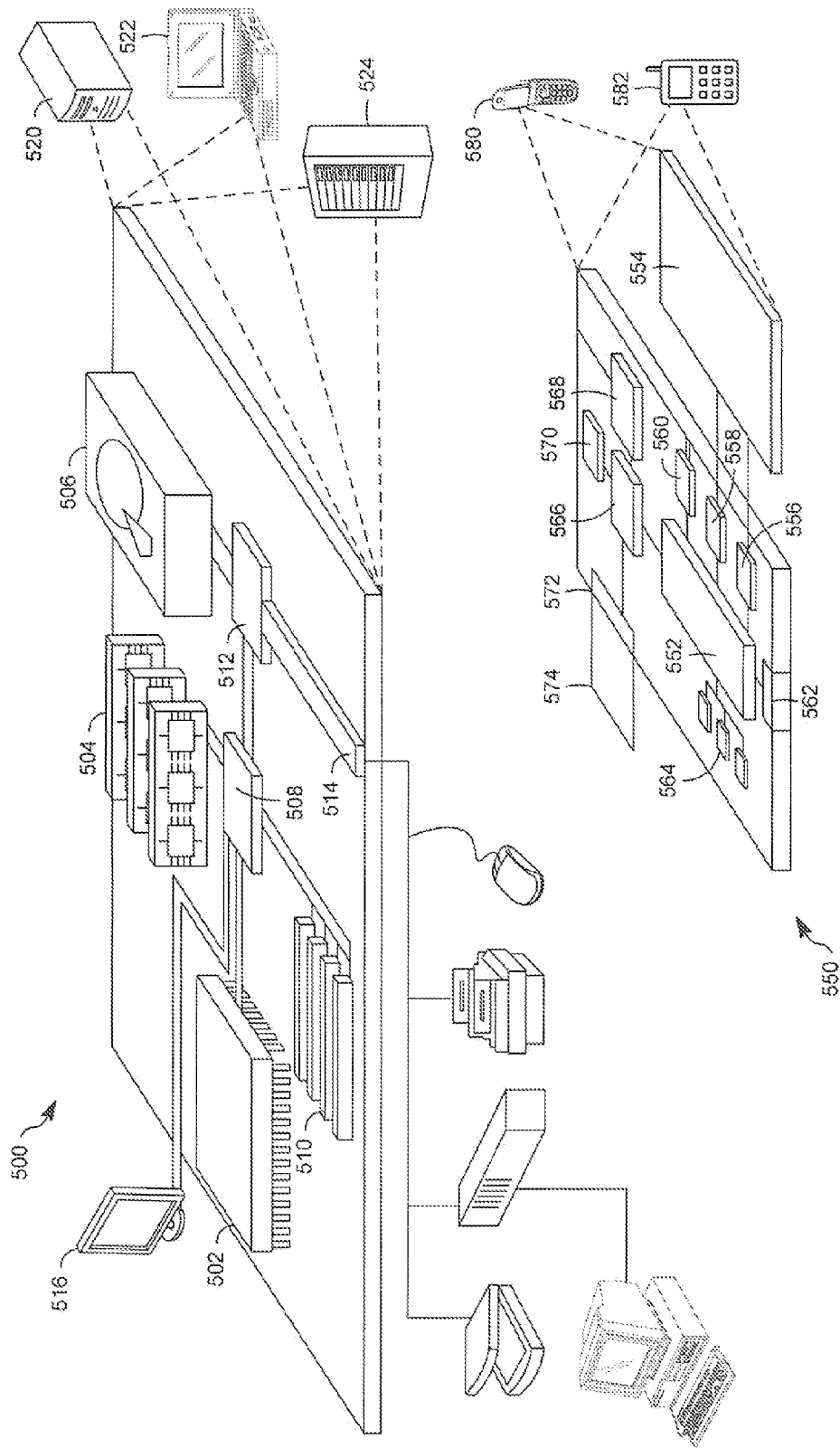
FIG. 5 is a block diagram illustrating example or representative computing devices and associated elements that may be used to implement one or more systems, devices, and methods of FIGS. 1A-4, in accordance with aspects of the disclosure.

FIG. 5 is a diagram illustrating example or representative devices, such as computing devices, portable computing devices etc., and associated elements including various internal circuitry that may be used to implement one or more systems, devices, apparatuses, and methods of FIGS. 1A-4, in accordance with aspects of the disclosure.

In an implementation, FIG. 5 shows an example of a computer device 500 and a mobile computer device 550 (e.g., mobile communication device including a low-power mobile communication device, such as, for example, mobile phone, cellular phone, etc.), which may be used in accordance with aspects, methods, and techniques, as described and provided herein. The computing device 500 may represent various forms of digital computers, such as personal computers, laptops, tablets, desktops, workstations, personal digital assistants, servers, blade servers, mainframes, and other appropriate computers. The computing device 550 may represent various forms of mobile devices, such as personal digital assistants, cellular telephones, smart phones, and other similar computing devices. The components shown herein, their connections and relationships, and their functions, are meant to be exemplary only, and are not meant to limit implementations described herein and/or claimed in this disclosure.

The computing device 500 may include one or more processors 502, memory 504, a storage device 506, a high-speed interface 508 connecting to memory 504 and high-speed expansion ports 510, and a low speed interface 512 connecting to low speed bus 514 and storage device 506. One or more of the components 502, 504, 506, 508, 510, and 512, are interconnected using various busses, and may be mounted on a common motherboard or in other manners as appropriate. In an implementation, the processor 502 may be configured to process instructions for execution within the computing device 500, including instructions stored in the memory 504 or on the storage device 506 to display graphical information for a GUI on an external input/output device, such as display 516 coupled to high speed interface 508. In other implementations, multiple processors and/or multiple buses may be utilized, as appropriate, along with multiple memories and types of memory. Further, multiple computing devices 500 may be connected, with the device providing portions of the necessary operations (e.g., as a server bank, a group of blade servers, or a multi-processor system).

The memory 504 may be configured to store information within the computing device 500. In an implementation, the memory 504 may comprise one or more volatile memory units. In another implementation, the memory 504 may comprise one or more non-volatile memory units. The memory 504 may comprise another form of non-transitory computer-readable medium, such as a magnetic or optical disk.

The storage device 506 may be configured for providing mass storage for the computing device 500. In an implementation, the storage device 506 may comprise a non-transitory computer-readable medium, such as a floppy disk device, a hard disk device, an optical disk device, or a tape device, a flash memory, or other similar solid state memory device, or an array of devices, including devices configured for use in a storage area network or various other configurations. In some implementations, a computer program product may be tangibly embodied in an information carrier. The computer program product may include instructions that, when executed, perform one or more methods, such as those described herein. In another implementation, the information carrier may comprise a non-transitory computer-readable medium or a non-transitory machine-readable medium, such as the memory 504, the storage device 506, or memory on the processor 502.

The high speed controller 508 may be configured to manage bandwidth-intensive operations for the computing device 500, while the low speed controller 512 may be configured to manage lower bandwidth-intensive operations. Such allocation of functions may be exemplary only. In an implementation, the high-speed controller 508 may be coupled to the memory 504, the display 516 (e.g., through a graphics processor or accelerator), and/or to the high-speed expansion ports 510, which may be configured to accept various expansion cards (not shown). In the implementation, low-speed controller 512 may be coupled to the storage device 506 and/or the low-speed expansion port 514, wherein the low-speed expansion port, which may include various communication ports (e.g., USB, Bluetooth, Ethernet, wireless Ethernet, etc.) may be coupled to one or more input/output devices, such as a keyboard, a pointing device, a scanner, or a networking device, such as a switch or router, e.g., through a network adapter.

The computing device 500 may be implemented in a number of different forms, in a manner as shown in FIG. 5. For example, the computing device 500 may be implemented as a standard server 520, or multiple times in a group of such servers. The computing device 500 may be implemented as part of a rack server system 524. In addition, the computing device 500 may be implemented in a personal computer (PC), such as a laptop computer 522. In another implementation, components from the computing device 500 may be combined with other components in a mobile device (not shown), such as device 550. One or more of such devices may include one or more of computing devices 500, 550, and an entire system may be made up of multiple computing devices 500, 550 communicating with one another.

The computing device 550 may include one or more processors 552, memory 564, an input/output device, such as a display 554, a communication interface 566, and a transceiver 568, among various other components. The device 550 may include a storage device, such as a micro-drive or some other related device, to provide additional storage. One or more of the components 550, 552, 564, 554, 566, and 568 may be interconnected using various buses, and several of the components may be mounted on a common motherboard or in other manners as appropriate.

The processor 552 may be configured to execute instructions within the computing device 550, including instructions stored in the memory 564. The processor 552 may be implemented as a chipset of chips that include separate and multiple analog and digital processors. In an implementation, the processor 552 may provide for coordination of the other components of the device 550, such as control of user interfaces, applications run by device 550, and wireless communication by device 550.

The processor 552 may be configured to communicate with a user through a control interface 558 and a display interface 556 coupled to a display 554. The display 554 may comprise, for example, a TFT LCD (Thin-Film-Transistor Liquid Crystal Display) or an OLED (Organic Light Emitting Diode) display, or other appropriate display technology. The display interface 556 may comprise appropriate circuitry for driving the display 554 to present graphical and other information to a user. The control interface 558 may receive commands from a user and convert them for submission to the processor 552. In an implementation, an external interface 562 may be provide in communication with the processor 552 to enable near area communication of device 550 with various other devices. In an example, the external interface 562 may provide for wired communication in some implementations, or for wireless communication in other implementations, and multiple interfaces may be utilized.

The memory 564 may be configured to store information within the computing device 550. The memory 564 may be implemented as one or more of a non-transitory computer-readable medium or media, one or more volatile memory units, or one or more non-volatile memory units. Expansion memory 574 may be provided and connected to device 550 through expansion interface 572, which may include, for example, a SIMM (Single In Line Memory Module) card interface. Such expansion memory 574 may provide extra storage space for device 550, or may also store applications or other information for device 550. Specifically, in an example, expansion memory 574 may include instructions to carry out or supplement the processes described above, and may include secure information. Thus, for example, the expansion memory 574 may be provide as a security module for device 550, and may be programmed with instructions that permit secure use of device 550. Further, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 564, expansion memory 574, or memory on processor 552, that may be received, for example, over transceiver 568 or external interface 562.

The device 550 may be configured to communicate wirelessly through communication interface 566, which may include digital signal processing circuitry where necessary. In an implementation, a communication interface 566 may provide for communications under various modes or protocols, such as GSM voice calls, SMS, EMS, or MMS messaging, CDMA, TDMA, PDC, WCDMA, CDMA2000, or GPRS, among others. In an example, such communication may occur, for example, through a radio-frequency transceiver 568. Further, short-range communication may occur, such as using a Bluetooth, WiFi, or other such transceiver (not shown). Still further, a GPS (Global Positioning System) receiver module 570 may provide additional navigation- and/or location-related wireless data to device 550, which may be used as appropriate by applications running on device 550.

The device 550 may be configured to communicate audibly using audio codec 560, which may receive spoken information from a user and convert it to usable digital information. In an example, an audio codec 560 may likewise generate audible sound for a user, such as through a speaker, e.g., in a handset of the device 550. In various implementations, such sound may include sound from voice telephone calls, may include recorded sound (e.g., voice messages, music files, etc.) and may include sound generated by applications operating on the device 550.

The computing device 550 may be implemented in a number of different forms, in a manner as shown in FIG. 5. For example, the computing device 550 may be implemented as a mobile communication device 580 including a cellular telephone and/or some other low power mobile communication devices. In another example, the computing device 550 may be implemented as part of a smart phone 582, personal digital assistant, or some other similar mobile device.

As such, various implementations of the systems, methods, and techniques described herein may be realized in digital electronic circuitry, integrated circuitry, specially designed ASICs (application specific integrated circuits), computer hardware, firmware, software, and/or combinations thereof. These various implementations may include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and may be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a non-transitory machine-readable medium that is configured to receive machine instructions as a machine-readable signal. In various examples, the term "machine-readable signal" may refer to any signal used to provide machine instructions and/or data to a programmable processor.

In an implementation, to provide for interaction with a user, the systems, methods, and techniques described herein may be implemented on a computer having a display device (e.g., a CRT (cathode ray tube) or LCD (liquid crystal display) monitor) for displaying information to the user and a keyboard and a pointing device (e.g., a mouse or a trackball) by which the user may provide input to the computer. Other types of devices may be used to provide for interaction with a user as well; for example, feedback provided to the user may be any form of sensory feedback (e.g., visual feedback, auditory feedback, or tactile feedback); and input from the user may be received in any form, including acoustic, speech, or tactile input.

In various examples, the systems, methods, and techniques as described herein may be implemented in a computing system that includes a back end component (e.g., as a data server), or that includes a middleware component (e.g., an application server), or that includes a front end component (e.g., a client computer having a graphical user interface or a Web browser through which a user may interact with an implementation of the systems, methods, and techniques described here), or any combination of such back end, middleware, or front end components. The components of the system may be interconnected by any form or medium of digital data communication (e.g., a communication network). Examples of communication networks include a local area network ("LAN"), a wide area network ("WAN"), and the Internet.

The computing system may include clients and servers. A client and server are generally remote from one another and typically interact through a communication network. The relationship of client and server arises by virtue of computer programs running on the respective computers and having a client-server relationship to one another.

Further, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

The above embodiments that have been described in particular detail are merely example or possible embodiments, and that there are many other combinations, additions, or alternatives that may be included.

The particular naming of the components, capitalization of terms, the attributes, data structures, or any other programming or structural aspect is not mandatory or significant, and the mechanisms that may be used to implement aspects of the disclosure or its features may have different names, formats, or protocols. Further, the system may be implemented via a combination of hardware and software, as described, or entirely in hardware elements. Further, any particular division of functionality between the various system components described herein is merely exemplary, and not mandatory; functions performed by a single system component may instead be performed by multiple components, and functions performed by multiple components may instead performed by a single component.

In accordance with aspects of the disclosure, some portions of above description present features in terms of algorithms and symbolic representations of operations on information. These algorithmic descriptions and representations may be used by those skilled in the data processing arts to most effectively convey the substance of their work to others skilled in the art. These operations, while described functionally or logically, are understood to be implemented by computer programs. Moreover, it has also proven convenient at times, to refer to these arrangements of operations as modules or by functional names, without loss of generality.

Unless specifically stated otherwise as apparent from the above discussion, throughout the description, discussions utilizing terms such as "processing" or "computing" or "calculating" or "determining" or "displaying" or "providing" or the like, refer to the action and processes of a computer system, or similar electronic computing device, that manipulates and transforms data represented as physical (electronic) quantities within the computer system memories or registers or other such information storage, transmission or display devices.

What is claimed is:

1. A device, comprising:
    a base configured to include internal circuitry including at least one processor and at least one memory; and
    a display pivotally coupled to the base and configured for movement between an open position and closed position, the display including:
        an enclosure having an exterior side surface and an interior side surface opposite the exterior side surface,
        a panel coupled to a central region of the interior side surface of the enclosure, the panel including an electronic visual display, and
        a bezel coupled to a peripheral side wall of the enclosure and extending toward a central portion of the enclosure so as to overlap a peripheral portion of the electronic visual display of the panel, the bezel having an interior side surface that covers the peripheral side wall of the enclosure and an exterior side surface of the peripheral portion of the electronic visual display of the display panel, with the overlapped portion of the electronic visual display interposed between the interior side surface of the enclosure and the interior side surface of the bezel, the bezel having at least one integral bumper protrusion protruding from the exterior side surface, with a malleable coating on the at least one bumper protrusion that contacts the base when the display is in the closed position.

2. The device of claim 1, wherein the bezel is formed as a frame that extends around the panel to cover exposed areas of the panel between the electronic visual display and peripheral side wall of the enclosure.

3. The device of claim 1, wherein the exterior side surface of the bezel includes the malleable coating over its entirety including the at least one bumper protrusion.

4. The device of claim 1, wherein the bezel is formed of a polymer material with the entire exterior side surface having the malleable coating including the at least one bumper protrusion.

5. The device of claim 1, wherein the bezel is formed of at least one of aluminum, titanium, magnesium, chromoly, steel, stainless steel, polymer, plastic, resin, and rubber.

6. The device of claim 1, wherein the malleable coating includes an elastic material including at least one of rubber, silicone, plastic, and polymer.

7. The device of claim 1, wherein the at least one bumper protrusion includes a bumper protrusion extending in a continuous line around the bezel.

8. The device of claim 1, wherein the at least one bumper protrusion includes a plurality of bumper protrusions positioned around the exterior side surface of the bezel.

9. The device of claim 1, wherein the bezel includes a contoured profile with the at least one bumper protrusion protruding from the exterior side surface of the bezel.

10. The device of claim 1, wherein the bezel is coupled to the enclosure with at least one of a bonding agent, an adhesive, solder, and at least one fastener including at least one of a screw, a rivet, an anchor, and a snaplock.

11. The device of claim 1, wherein:
    the device includes a portable computing device including at least one of a laptop and a mobile phone, and
    the electronic visual display includes a liquid crystal display.

12. A method for assembling a computing device, comprising:
    preparing a base for the computing device, the base configured for including internal circuitry including at least one processor and at least one memory;
    coupling a display for the computing device to the base for pivotal movement between an open position and closed position, the display including an enclosure having an interior side surface and an exterior side surface opposite the interior side surface;
    coupling a panel to a central region of the interior side surface of the enclosure of the display, the panel including an electronic visual display;
    forming a bezel with interior and exterior side surfaces, the bezel including at least one integral bumper protrusion protruding from the exterior side surface of the bezel;
    applying a malleable coating to the at least one bumper protrusion, the malleable coating contacting the base when the display is in the closed position; and
    coupling the bezel to a peripheral region of the interior side surface of the enclosure of the display, the bezel extending from the peripheral region of the enclosure toward the central portion of the enclosure so as to overlap a corresponding peripheral portion of the electronic visual display, the interior side surface of the bezel covering the peripheral region of the interior side surface of the enclosure and an exterior side surface of the corresponding peripheral portion of the electronic visual display, with the overlapped portion of the electronic visual display interposed between the enclosure and the bezel.

13. The method of claim 12, wherein the exterior side surface of the bezel includes a malleable coating over its entirety including the at least one bumper protrusion.

14. The method of claim 12, wherein the bezel is formed of at least one of aluminum, titanium, magnesium, chromoly, steel, stainless steel, polymer, plastic, resin, and rubber.

15. The method of claim 12, wherein the malleable coating includes an elastic material including at least one of rubber, silicone, plastic, and polymer.

16. The method of claim 12, wherein the at least one bumper protrusion includes a bumper protrusion extending in a continuous line around the bezel.

17. The method of claim 12, wherein the at least one bumper protrusion includes a plurality of bumper protrusions positioned around the exterior side surface of the bezel.

18. The method of claim 12, wherein the bezel is coupled to the enclosure with at least one of a bonding agent, an adhesive, solder, and at least one fastener including at least one of a screw, a rivet, an anchor, and a snap lock.

19. The method of claim 12, wherein:
the device includes a portable computing device including at least one of a laptop and a mobile phone, and
the electronic visual display includes a liquid crystal display.

20. An apparatus, comprising:
internal circuitry including at least one processor and at least one memory;
a base enclosure formed to include the internal circuitry;
a display enclosure formed to receive a display panel including an electronic visual display positioned centrally on an interior region of the display enclosure, the display enclosure being pivotally coupled to the base and configured for movement between an open position and closed position, the display enclosure including a bezel coupled to a periphery of the display enclosure and extending toward a central portion of the display enclosure so as to overlap a peripheral portion of the electronic visual display, the bezel having an interior side surface that covers the periphery of the display enclosure and an exterior side surface of the peripheral portion of the electronic visual display, with the overlapped portion of the electronic visual display interposed between the display enclosure and the bezel, the bezel having at least one integral bumper feature protruding from the exterior side surface, a malleable coating provided on the at least one bumper features that contacts the base enclosure when the display enclosure is in the closed position.

21. The device of claim 1, wherein the at least one bumper protrusion comprises a plurality of bumper protrusions formed along the exterior side surface of the bezel, each of the plurality of bumper protrusions being positioned so as to contact a corresponding portion of an interior side surface of the base, and each of the plurality of bumper protrusions extending from the exterior side of the bezel toward the base and having a polygonal cross sectional shape.

* * * * *